United States Patent [19]

Higuchi et al.

[11] Patent Number: 5,985,023
[45] Date of Patent: *Nov. 16, 1999

[54] METHOD FOR GROWTH OF A NITROGEN-DOPED GALLIUM PHOSPHIDE EPITAXIAL LAYER

[75] Inventors: Susumu Higuchi; Masato Yamada; Munehisa Yanagisawa, all of Gunma-ken, Japan

[73] Assignee: Shin-Etsu Handotai Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/620,158

[22] Filed: Mar. 22, 1996

[30] Foreign Application Priority Data

Mar. 27, 1995 [JP] Japan .................................. 7-067778

[51] Int. Cl.$^6$ .................................................. C30B 19/10
[52] U.S. Cl. .............................. 117/54; 117/56; 117/57; 117/953
[58] Field of Search ................... 117/54, 57, 56, 117/955

[56] References Cited

U.S. PATENT DOCUMENTS

| | | | |
|---|---|---|---|
| 3,931,631 | 1/1976 | Groves et al. | 357/17 |
| 3,951,700 | 4/1976 | Beppu et al. | 117/54 |
| 3,964,940 | 6/1976 | Hart et al. | 117/955 |
| 4,001,056 | 1/1977 | Groves et al. | 117/105 |
| 4,101,920 | 7/1978 | Nagasawa et al. | 357/17 |
| 5,529,938 | 6/1996 | Umeda et al. | 117/955 |
| 5,571,321 | 11/1996 | Yanagisawa et al. | 117/955 |

OTHER PUBLICATIONS

Patent Abstracts of Japan, vol. 018, No. 318 (E–1562), Jun. 16, 1994 & JP 06 069542 A (Shin Etsu Handotai Co Ltd), Mar. 11, 1994.

Miyoshi et al., "Metalorganic Vapor Phase Epitaxy of $GaP_{1-x}N_x$ Alloys On GAP", Applied Physics Letters, vol. 63, No. 25, Dec. 20, 1993, pp. 3506–3508.

Lagon et al., "Efficient Green Electroluminescat Junctions In GAP," Solid–State Electronics vol. 14, pp. 55–70, Jan. 1971.

Thurmond et al., "The Equilibrium Pressure of $N_2$ over GaN", J. Electrochem. Soc.: Solid–State Science and Technology, May 1972, pp. 622–626.

Stringfellow, "Calculation of the Solubility and Solid–Gas Distribution Coefficient of N in GaP", J. Electrochem. Soc.: Solid–State Science and Technology, Dec. 1972, pp. 1780–1782.

Panish et al., "Ga–Al–As:Phase, Thermodynamic and Optical Properties", J. Phys. Chem. Solids, vol. 30, pp. 129–137.

Akita et al., Nitrogen doping of GaP during LPE growth–a kinetic study, Journal of Crystal Growth, vol. 28, No. 2 pp 293–266, 1975.

Hayes et al. "Nitrogen Doping Profiles in Gallium Phosphide Grown by Liquid Phase Epitgaxy", Journal of Crystal Growth vol. 46, No. 1 pp. 59–68, 1979.

Kazmierski et al, "The Kinetics of Si Incorporation in Ga Melt for LPE Growth of GaP Doped with Nitrogen From NH3", Journal of Crystal Growth, vol. 60 No. 2 pp. 434–440, 1982.

*Primary Examiner*—Robert Kunemund
*Attorney, Agent, or Firm*—Wenderoth, Lind & Ponack L.L.P.

[57] ABSTRACT

While a nitrogen-doped gallium phosphide epitaxial layer in an epitaxial wafer as a material of light-emitting diodes is desired to have a high concentration of nitrogen in order to enhance the efficiency of light emission, the present invention provides a reliable and efficient means to accomplish a high nitrogen concentration by the increase of the concentration of ammonia as a nitrogen source in the doping atmosphere to the contrary to the general understanding that increase of the ammonia concentration to exceed a limit rather has an effect of decreasing the concentration of nitrogen doped in the epitaxial layer. The inventive method is based on the discovery that an exponential relationship is held between the growth rate of the epitaxial layer and the concentration of nitrogen in the thus grown epitaxial layer.

3 Claims, 5 Drawing Sheets

NH3 CONCENTRATION IN ATMOSPHERE, % by volume

METHOD FOR GROWTH OF A NITROGEN-DOPED GALLIUM PHOSPHIDE EPITAXIAL LAYER

BACKGROUND OF THE INVENTION

1. Field of the Invention

The present invention relates to a method for the preparation of a gallium phosphide epitaxial wafer used in the manufacture of green-emitting gallium phosphide light-emitting diodes. More particularly, the invention relates to a method for growth of a nitrogen-doped gallium phosphide epitaxial layer(s) in which an epitaxially grown gallium phosphide layer(s) is doped with nitrogen as an isoelectronic trap.

2. Description of the Related Art

Devices of semiconductor-based light-emitting diode are manufactured usually from a semiconductor epitaxial wafer having a p-n junction obtained by forming a plurality of epitaxially grown semiconductor layers on a semiconductor substrate. For example, a green-emitting gallium phosphide light-emitting diode is obtained by using a gallium phosphide epitaxial wafer prepared by successively forming an n-type gallium phosphide layer and a p-type gallium phosphide layer on an n-type gallium phosphide substrate.

As is described above, an epitaxially grown layer of gallium phosphide, referred to simply as GaP layer hereinafter, is formed on an n-type gallium phosphide substrate, including a multilayered n-type GaP substrate obtained by forming an epitaxially grown layer(s) of n-type GaP in advance on the n-type GaP substrate, by the method of liquid-phase epitaxial growth such as the so-called melt-back liquid-phase epitaxial growth method.

The melt-back liquid-phase epitaxial growth method above mentioned is a method in which a melt of gallium is put on a gallium phosphide substrate followed by temperature elevation, for example, up to 950° C. so as to melt the surface layer of the GaP substrate into the melt of gallium to form a solution, and then the temperature is decreased at a specified rate, for example, down to 800° C. so that the gallium phosphide dissolved in the melt of gallium is precipitated onto the surface of the gallium phosphide substrate to cause epitaxial growth of a GaP layer.

As is known, GaP is an indirect-transition semiconductor which exhibits only a very low light-emitting efficiency even by forming a p-n junction as such. Accordingly, it is usually practiced to enhance the light-emitting efficiency by doping the n-type GaP layer in the vicinity of the p-n junction with nitrogen which serves as an emission center or, namely, an isoelectronic trap. To say particularly, it is practiced to effect the liquid-phase epitaxial growth of an n-type gallium phosphide layer by passing a doping gas containing ammonia $NH_3$ over the melt of gallium.

As is shown by the chemical reaction equation (1) below, $$NH_3(gas) + Ga(liquid) \rightarrow GaN(solid) + 3/2 H_2(gas), \quad (1)$$

gallium nitride GaN is formed in the melt of gallium by the reaction of gallium and ammonia when a doping gas containing ammonia is passed over the melt of gallium. The nitrogen taken into the melt of gallium in the form of gallium nitride serves as a dopant in the n-type GaP layer as the liquid-phase epitaxial growth proceeds.

The light-emitting diode prepared from a gallium phosphide epitaxial wafer having an n-type GaP layer doped with nitrogen in the above described manner, referred to as the GaP(N) light-emitting diode hereinafter, emits a yellowish green light having a peak wavelength of about 567 nm. FIG. 4 is a graph showing the luminous intensity of a GaP(N) light-emitting diode as a function of the concentration of nitrogen in the nitrogen-doped n-type GaP layer.

In the GaP(N) light-emitting diode, the concentration of nitrogen doped in the n-type GaP layer to serve as an isoelectronic trap is an important factor which determines the light-emitting efficiency of the GaP(N) light-emitting diode. As is shown in FIG. 4, the luminous intensity of the GaP(N) light-emitting diode increases as the concentration of nitrogen is increased within the solid-solubility limit of nitrogen in GaP. Accordingly, the nitrogen concentration in an n-type gallium phosphide layer is increased in the prior art by increasing the concentration of ammonia in the gaseous atmosphere for doping.

FIG. 5 shows the relationship between the concentration of ammonia in the gaseous atmosphere and the concentration of nitrogen in the GaP layer grown under the conditions including a growing temperature decreased from 950° C. to 800° C. and a growth rate of 30 μm per hour. As is understood from FIG. 5, the concentration of nitrogen in the n-type GaP layer increases as the concentration of ammonia in the gaseous atmosphere is increased within the range where the concentration of ammonia in the gaseous atmosphere does not exceed about 0.07% by volume. When the concentration of ammonia is further increased to exceed about 0.07% by volume, the concentration of nitrogen in the n-type GaP layer is rather decreased as the concentration of ammonia is increased.

This phenomenon is the reason for the extreme difficulties encountered in the method of controlling the concentration of nitrogen in the GaP layer by the modification of the concentration of ammonia in the gaseous doping atmosphere, when it is desired to control the nitrogen concentration in the GaP layer at a high level within the region of high concentration of ammonia in the gaseous atmosphere.

SUMMARY OF THE INVENTION

The present invention accordingly has an object, in view of the above described problems in the prior art method for the growth of a nitrogen-doped GaP layer by the process of liquid-phase epitaxial growth, to provide a novel method by which the concentration of nitrogen in the GaP layer can be controlled in a wide concentration range with high accuracy.

Namely, the present invention provides a method for the growth of an epitaxial layer(s) of GaP doped with nitrogen by the method of liquid-phase epitaxial growth with ammonia as the source of nitrogen, which comprises controlling the concentration of nitrogen [N] in the GaP epitaxial layer according to the equation:

In the above described epitaxial growth method, the type of electroconductivity of the nitrogen-doped GaP epitaxial layer is, for example, the n-type.

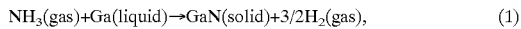

$$[N] = [N_0] \cdot (V/V_0)^a, \quad (2)$$

in which V is the growth rate of the GaP epitaxial layer doped with nitrogen, $V_0$ is the reference growth rate of the GaP layer doped with nitrogen, $[N_0]$ is the concentration of nitrogen in the GaP layer doped with nitrogen when V is equal to $V_0$ and the exponent a is a constant.

BRIEF DESCRIPTION OF THE DRAWING

FIG. 1 is a schematic cross sectional view of the apparatus used in practicing the method of the present invention.

DETAILED DESCRIPTION OF THE PREFERRED EMBODIMENTS

Figure 2A:
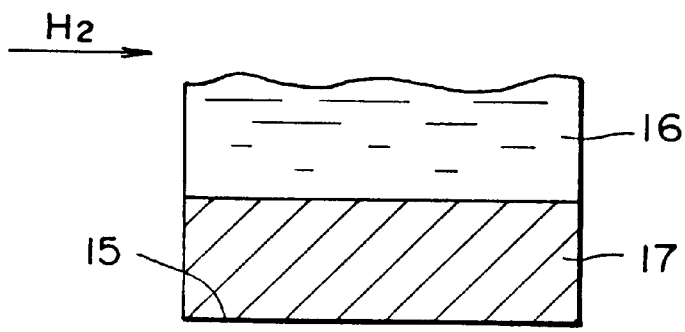
FIGS. 2A, 2B and 2C are each a schematic illustration of one of the steps undertaken in the inventive method by a cross section.

The inventors have conducted investigations, in connection with the prior art method for the control of the concentration of nitrogen in a gallium phosphide epitaxial layer(s) by the adjustment of the concentration of ammonia in the gaseous doping atmosphere. Further, they conducted investigations about the mechanism of the phenomenon that the concentration of nitrogen in the GaP layer(s) is rather decreased as the concentration of ammonia in the gaseous atmosphere is increased when the concentration of ammonia in the gaseous atmosphere is relatively high, for example, to exceed 0.07% by volume. The principal reason for the above described phenomenon obtained as a result of the investigations is that, in conducting growth of a nitrogen-doped GaP layer(s) by the liquid-phase epitaxial growth method in an atmosphere of a gas containing ammonia, where the concentration of ammonia in the gaseous atmosphere exceeds a certain critical concentration of, for example, 0.07% by volume mentioned above, gallium nitride GaN is formed by the reaction expressed by the above given chemical reaction equation (1) in the form of a film on the interface between the gaseous phase containing a carrier gas with ammonia and the liquid phase, i.e. melt of gallium, or, namely, on the surface of the melt of gallium for the liquid-phase epitaxial growth. As a result, this gallium nitride film inhibits the transfer of the ammonia in the gaseous atmosphere into the liquid phase of the molten gallium and the thickness of this gallium nitride film is increased as the concentration of ammonia in the gaseous atmosphere is increased.

The inventors have further discovered that, when the growth rate of the GaP layer(s) is increased to be sufficiently high, a sufficient amount of ammonia as the nitrogen source can be taken into the liquid phase of molten gallium before the gallium nitride film grows to have a large thickness and, as a consequence, the concentration of nitrogen in the GaP layer(s) as grown can be controlled with high accuracy over a wide range of concentration or, in particular, in a range of high concentration.

In the following, the method of the present invention is described in more detail, by taking the melt-back liquid-phase epitaxial growth method as an example and referring to the accompanying drawings.

FIG. 1 of the accompanying drawing is a schematic illustration of a cross sectional view of the apparatus used in the examples. In this apparatus, a boat 12 for the epitaxial growth of a GaP layer is placed in a furnace core tube 11. The boat 12 is provided with a plurality of cavities 15 and a GaP substrate 17 is fixed to the bottom of each of the cavities 15. The cavity 15 is filled with molten gallium 16 for the liquid-phase epitaxial growth to cover the GaP substrate 17. The cavities 15 are covered with a sliding plate 13 each having a perforation 14. FIG. 1 shows only one of the plurality of cavities 15, the other being omitted.

The core tube 11 of the furnace is surrounded by a heater 10 capable of heating the epitaxial growth system consisting of the GaP substrate 17, melt or solution of gallium 16 and boat 12 at a controlled temperature. One end of the core tube 11 serves as an inlet port for the introduction of gases including ammonia, carrier gas such as hydrogen, purging gas such as argon and the like to cause a flow through the core tube 11.

Following is a description of the procedure for the growth of a nitrogen-doped GaP epitaxial layer by the melt-back process by using the apparatus mentioned above and referring to FIG. 2. Each of FIGS. 2A to 2C illustrates the system consisting of a GaP substrate 17 and a melt or solution of gallium 16 only at a stage of the epitaxial growth process.

As is illustrated in FIG. 2A, in the first place, a melt of gallium 16 is provided to cover the surface of a GaP substrate 17 on the bottom of the cavity of the boat, which is, for example, an n-type GaP substrate doped with tellurium in a dopant concentration of 2 to $3 \times 10^{17}$ atoms/cm$^3$. The temperature of this growth system is set at 600° C. at this stage.

Figure 2B:
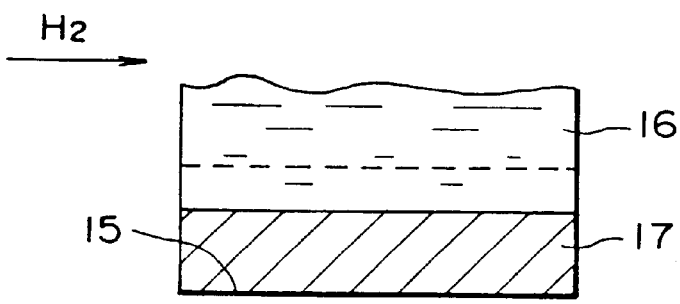

In the next place, the growth system is heated up to a temperature of 950° C. so that the surface layer of the n-type GaP substrate 17 is gradually dissolved in the melt of gallium 16 to form a solution of gallium saturated with GaP in a concentration corresponding to the temperature as is shown in FIG. 2B.

Figure 2C:
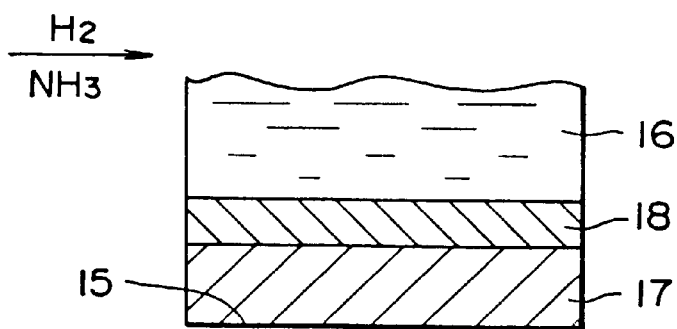
Figure 2A:
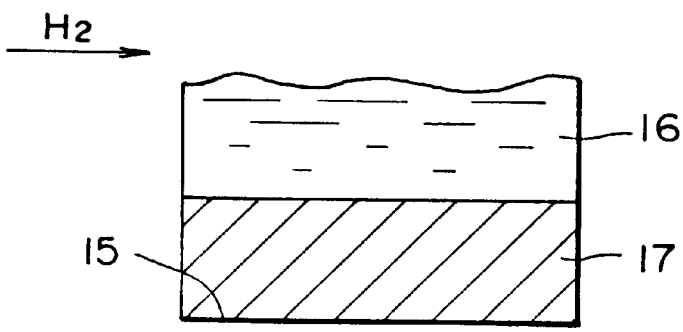
Figure 2B:
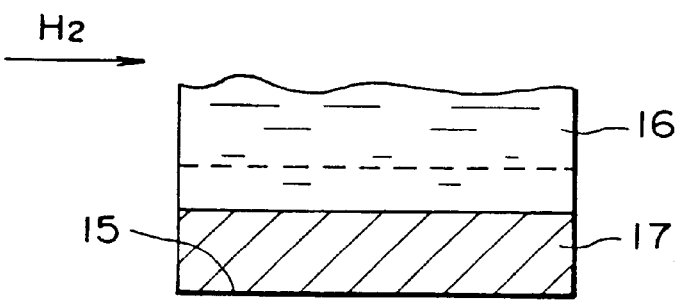
Figure 2C:
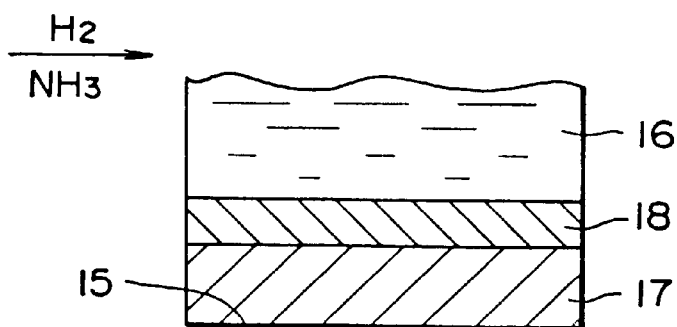

Thereafter, a gaseous mixture of hydrogen as a carrier gas and 0.085% by volume of ammonia as a nitrogen source is passed through the core tube 11 continuously, while the temperature of the growth system is gradually decreased at a specified rate from 950° C. to 800° C. so that the precipitation of GaP proceeds from the gallium solution 16 saturated with GaP onto the surface of the n-type gallium phosphide substrate 17 thus to form an epitaxial layer 18 of nitrogen-doped n-type GaP on the n-type GaP substrate 17 as is shown in FIG. 2C.

Figure 3:
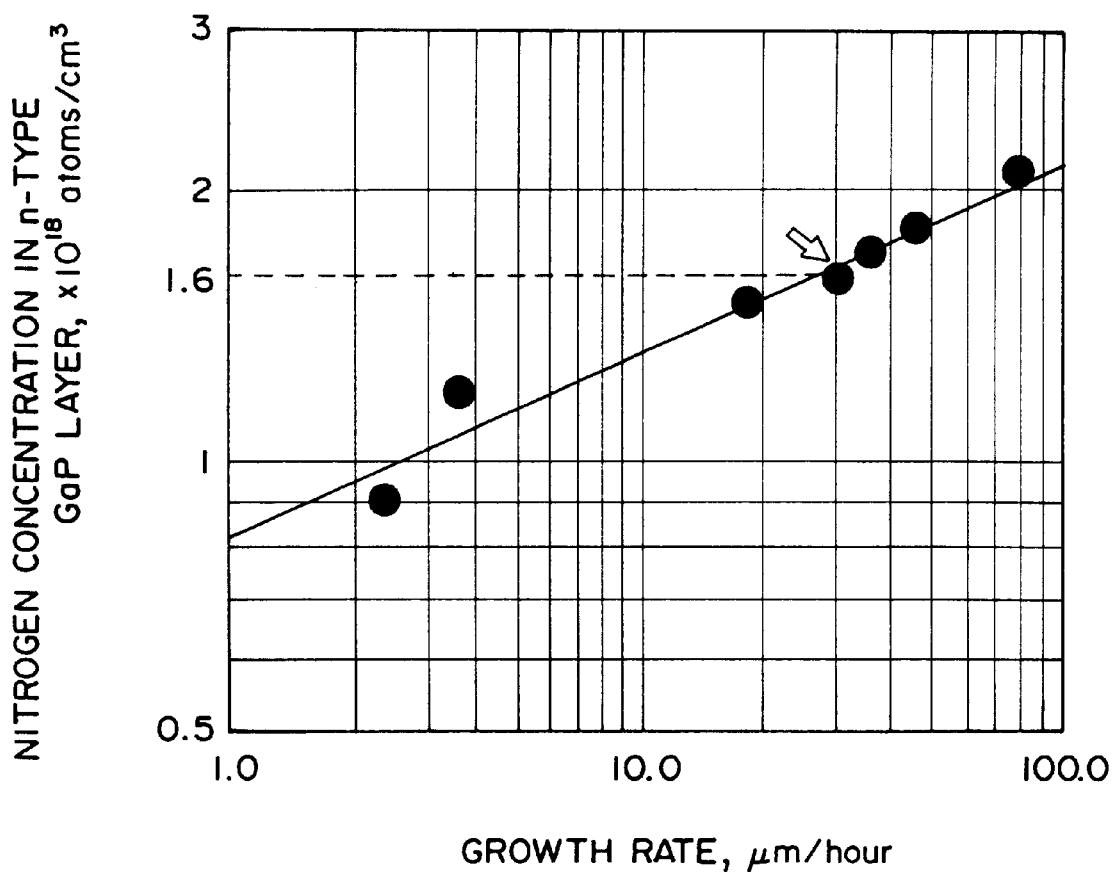
FIG. 3 is a graph showing the nitrogen concentration in the n-type GaP epitaxial layer as a function of the growth rate.
Figure 4:
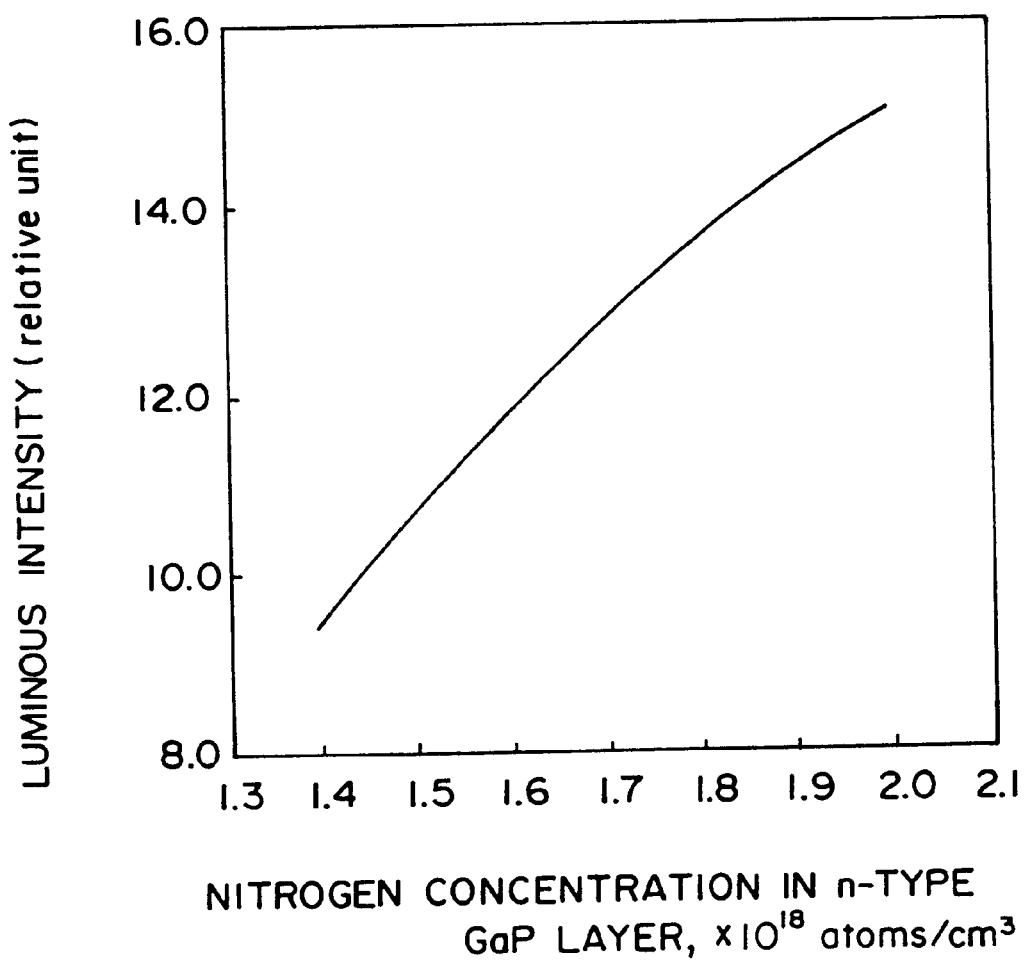
FIG. 4 is a graph showing the luminous intensity of GaP(N) light-emitting diodes as a function of the nitrogen concentration in the nitrogen-doped n-type GaP layer.

FIG. 3 is a graph in logarithmic scales showing the concentration of nitrogen in the nitrogen-doped n-type GaP layer obtained in the above described procedure carried out in the decreasing temperature range from 950° C. to 800° C. under a gaseous doping atmosphere containing 0.085% by volume of ammonia under varied growth rates taken on the abscissa axis.

As is shown in FIG. 3, the concentration of nitrogen doped in the n-type GaP layer was increased as the growth rate was increased and a very good linear correlation could be obtained on the logarithmic graph between the growth rate V and the nitrogen concentration [N] so that an approximate equation below can be held:

$$[N] = [N_0] \cdot (V/V_0)^a, \quad (3)$$

in which [N] is the concentration of nitrogen in atoms/cm$^3$ in the nitrogen-doped GaP layer, V is the growth rate of the layer in μm/hour, $V_0$ is a reference growth rate in μm/hour arbitrarily selected, [$N_0$] is the nitrogen concentration in atoms/cm$^3$ in the GaP layer when V is equal to $V_0$ and the exponent a is a constant.

For example, the linear relationship in the logarithmic scales shown in FIG. 3 can be expressed by the equation:

$$[N] = 1.6 \times 10^{18} \cdot (V/30)^{0.2}, \quad (4)$$

when $V_0$ is assumed to be 30 μm/hour as is indicated by the arrow on the graph of FIG. 3.

As is understood from FIG. 3, an accurate means is provided for the control of the nitrogen concentration in the nitrogen-doped epitaxial layer according to the method of the present invention for the epitaxial growth, by adjusting the growth rate of the GaP epitaxial layer. Therefore, a comparison of FIG. 3 with FIG. 5 indicates a possibility that the concentration of nitrogen doped in the GaP layer can be increased so high, even when the concentration of ammonia in the gaseous doping atmosphere exceeds the conventional upper limit, for example, to be higher than 0.07% by volume, by increasing the growth rate of the GaP epitaxial layer to exceed the growth rate in the conventional procedures.

Figure 5:
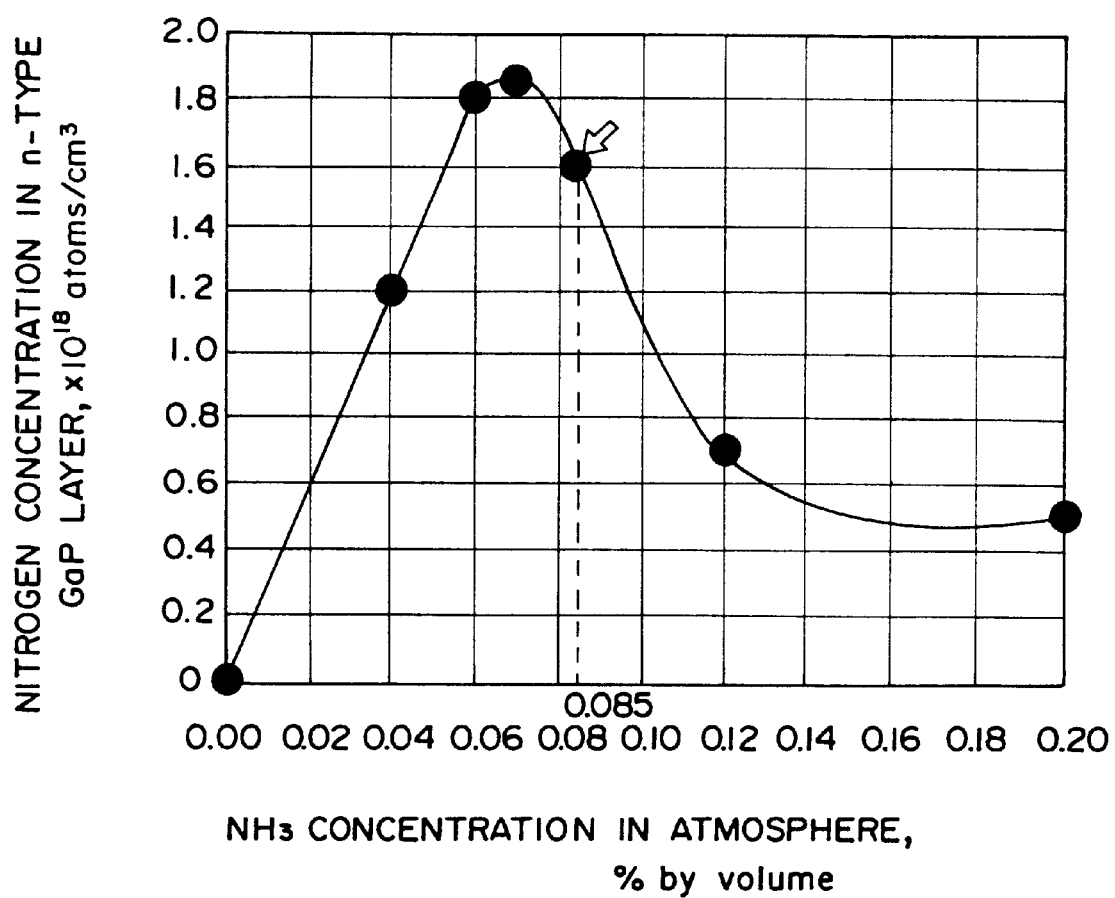
FIG. 5 is a graph showing the relationship between the ammonia concentration in the gaseous doping atmosphere and the nitrogen concentration in the nitrogen-doped n-type GaP layer.

A more detailed explanation is given on the concentration of nitrogen in the nitrogen-doped n-type GaP layer epitaxially grown for a particular case in which the growth rate of the layer was 30 $\mu$m/hour and the concentration of ammonia in the gaseous doping atmosphere was 0.085% by volume as shown in FIGS. 3 and 5, respectively, by the arrows. According to FIG. 5, for example, the nitrogen concentration when the ammonia concentration is 0.085% by volume indicated by the arrow is $1.6 \times 10^{18}$ atoms/cm$^3$, which is lower than the nitrogen concentration when the ammonia concentration is 0.07% by volume. According to FIG. 3, however, a high nitrogen concentration of $2 \times 10^{18}$ atoms/cm$^3$ can be obtained even under a doping atmosphere containing 0.085% by volume of ammonia, by increasing the growth rate of the epitaxial GaP layer from 30 $\mu$m/hour to 80 $\mu$m/hour.

According to the present invention, as is understood from the above given description, a highly accurate means is provided for the control of the concentration of nitrogen doped in the epitaxial GaP layer(s) within a wide range of the concentration or, in particular, in the range of high concentrations so that a high concentration of nitrogen in the nitrogen-doped GaP epitaxial layer(s), which is difficult to accomplish in the conventional method, can be obtained in a gaseous doping atmosphere containing ammonia in a high concentration. Accordingly, the epitaxial wafer obtained by the method of the present invention is useful as a material of green-emitting GaP(N) light-emitting diodes capable of exhibiting a greatly increased luminous intensity as a consequence of the increased concentration of nitrogen doped in the epitaxial layer(s).

What is claimed is:

1. A method for the growth of an epitaxial layer(s) of gallium phosphide doped with nitrogen by a process of liquid-phase epitaxial growth with ammonia as a source of nitrogen, which comprises controlling the concentration of nitrogen [N] being doped in the gallium phosphide epitaxial layer(s) by adjusting the growth rate of the gallium phosphide epitaxial layer(s).

2. The method as claimed in claim 1, wherein the concentration of nitrogen [N] being doped in the gallium phosphide epitaxial layer(s) is controlled according to the following equation:

$$[N]=[N_0](V/V_0)^a,$$

wherein V is a growth rate of the gallium phosphide epitaxial layer doped with nitrogen, $V_0$ is a reference growth rate of the gallium phosphide layer, $[N_0]$ is the concentration of nitrogen in the gallium phosphide layer doped with nitrogen when V is equal to $V_0$, and the exponent a is a constant.

3. The method as claimed in claim 1, wherein the epitaxial layer(s) of gallium phosphide possesses an n-type electric conductivity.

* * * * *